(12) United States Patent
Aleksov et al.

(10) Patent No.: US 9,076,882 B2
(45) Date of Patent: Jul. 7, 2015

(54) METHODS FOR HIGH PRECISION MICROELECTRONIC DIE INTEGRATION

(71) Applicant: Intel Corporation, Santa Clara, CA (US)

(72) Inventors: Aleksandar Aleksov, Chandler, AZ (US); Ravindranath V Mahajan, Chandler, AZ (US); Omkar Karhade, Chandler, AZ (US); Nitin Deshpande, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 97 days.

(21) Appl. No.: 13/908,016

(22) Filed: Jun. 3, 2013

(65) Prior Publication Data
US 2014/0357020 A1 Dec. 4, 2014

(51) Int. Cl.
*H01L 21/00* (2006.01)
*H01L 23/00* (2006.01)

(52) U.S. Cl.
CPC ....... *H01L 24/82* (2013.01); *H01L 2224/81005* (2013.01); *H01L 2224/73204* (2013.01); *H01L 24/81* (2013.01); *H01L 2224/81001* (2013.01)

(58) Field of Classification Search
None
See application file for complete search history.

(56) References Cited

U.S. PATENT DOCUMENTS

| 7,163,843 B2 * | 1/2007 | Kiendl et al. | 438/114 |
| 8,551,816 B2 * | 10/2013 | Cordes et al. | 438/109 |
| 2013/0175686 A1 * | 7/2013 | Meyer et al. | 257/738 |
| 2014/0017852 A1 * | 1/2014 | Kwon et al. | 438/108 |

* cited by examiner

*Primary Examiner* — Angel Roman
(74) *Attorney, Agent, or Firm* — Winkle, PLLC

(57) ABSTRACT

The subject matter of the present description relates to methods for the precise integration of microelectronic dice within a multichip package which substantially reduce or eliminate any misalign caused by the movement of the microelectronic dice during the integration process. These methods may include the use of a temporary adhesive in conjunction with a carrier having at least one recess for microelectronic die alignment, the use of a precision molded carrier for microelectronic die alignment, the use of magnetic alignment of microelectronic dice on a reusable carrier, and/or the use of a temporary adhesive with molding processes on a reusable carrier.

28 Claims, 15 Drawing Sheets

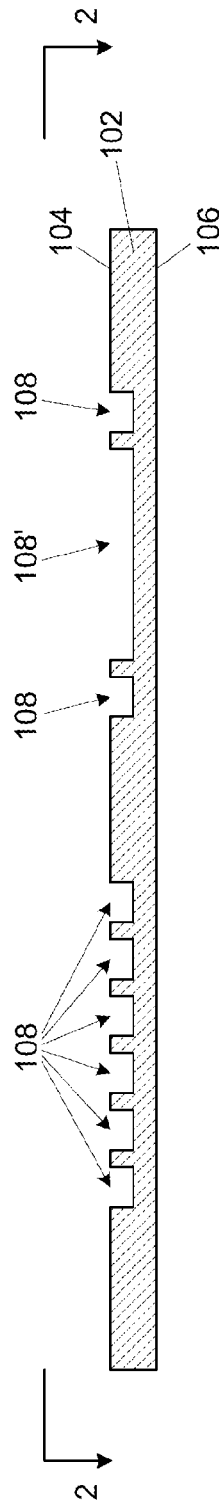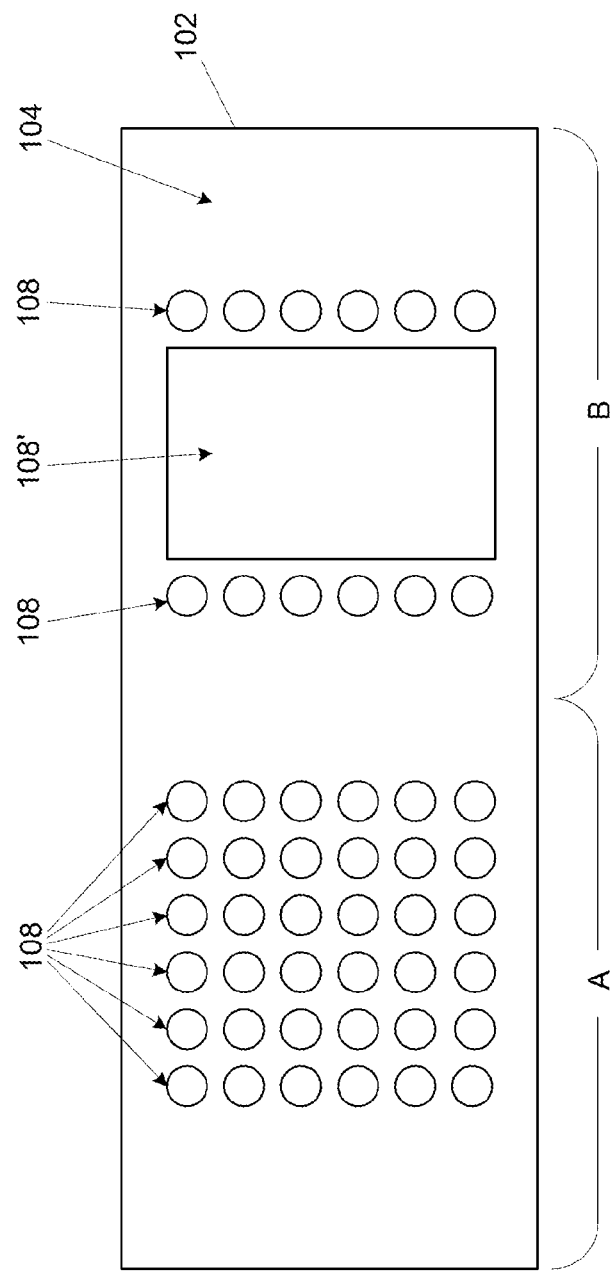

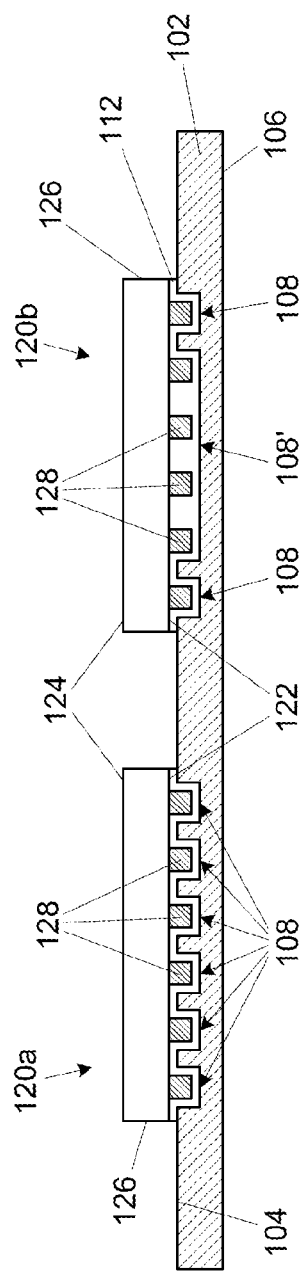
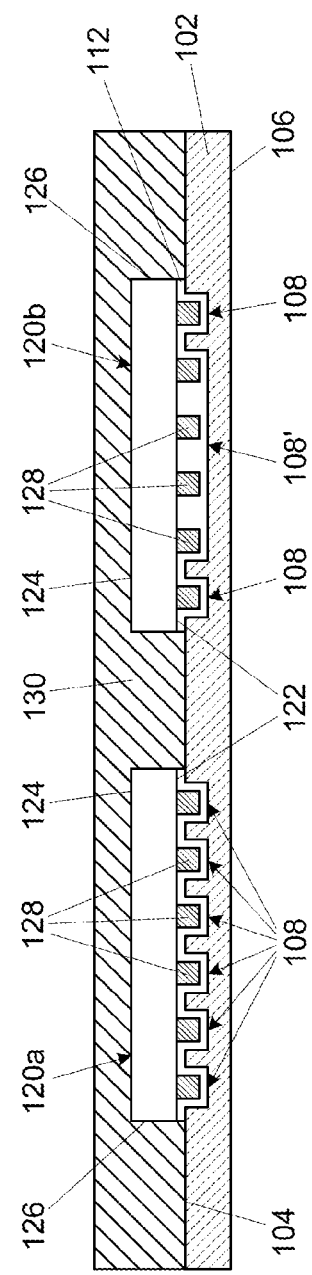
FIG. 7
FIG. 8

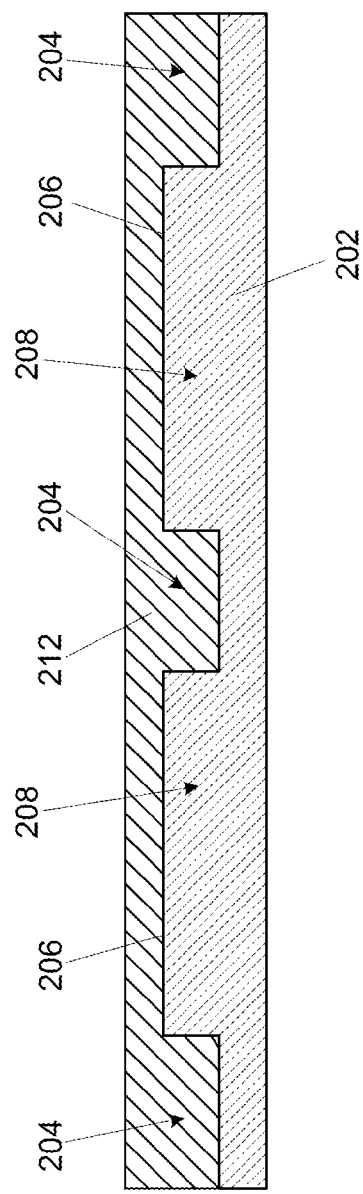
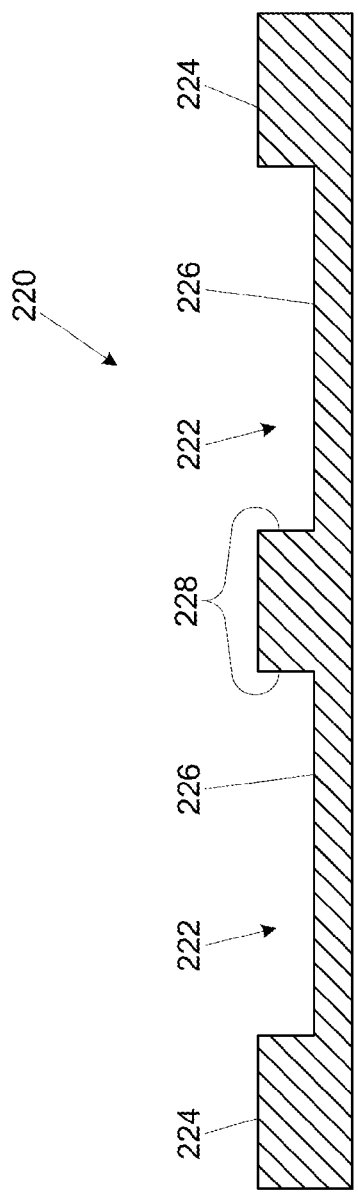

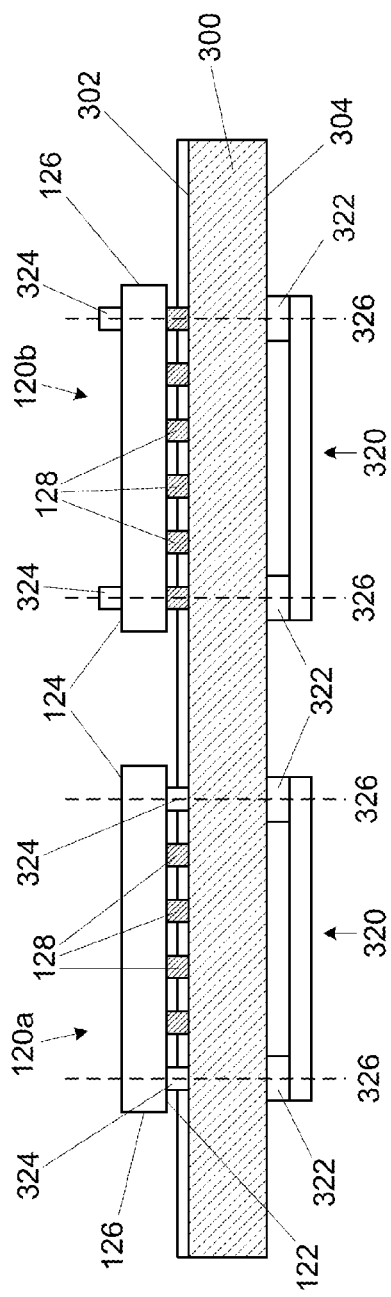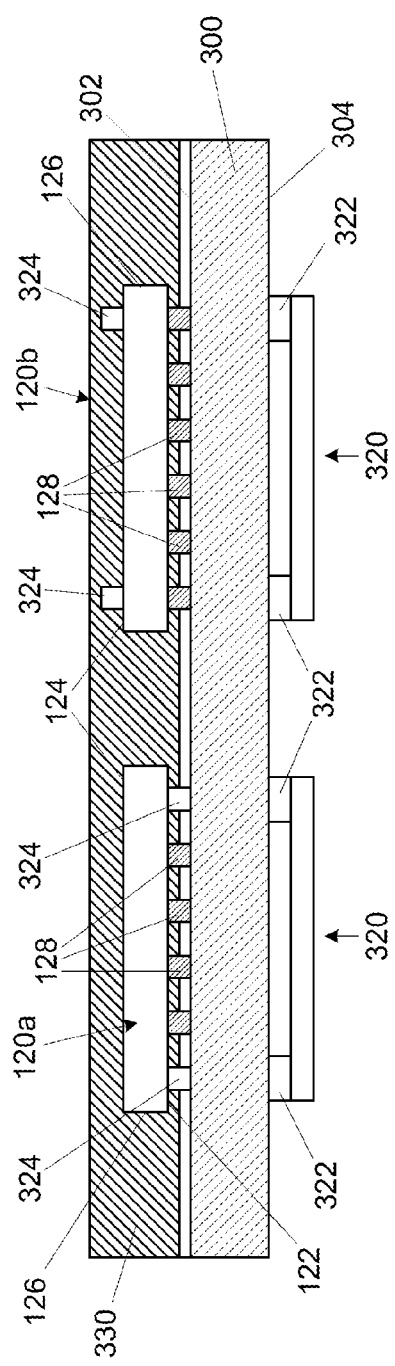
FIG. 19
FIG. 20

METHODS FOR HIGH PRECISION MICROELECTRONIC DIE INTEGRATION

TECHNICAL FIELD

Embodiments of the present description generally relate to the field of microelectronic package fabrication, and, more specifically, to methods of integrating microelectronic dice within a microelectronic package with high alignment precision.

BACKGROUND ART

The microelectronic industry is continually striving to produce ever faster and smaller microelectronic dice for use in various mobile electronic products, such as portable computers, electronic tablets, cellular phones, digital cameras, and the like. As these goals are achieved, the size of attachment structures, such as microelectronic interconnects for the microelectronic devices, and the space or pitch between these attachment structures becomes smaller. As such, any misalignment of any of the microelectronic dice caused by the movement of the microelectronic dice during integration can result in the failure of the microelectronic package, as will be understood to those skilled in the art. Therefore, there is an ongoing effort to design ever more precise methods for integrating microelectronic dice into microelectronic packages.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 1-11 illustrate side cross-sectional and plan views of a process of high precision microelectronic die integration, according to a first embodiment of the present description.

FIGS. 12-17 illustrate side cross-sectional views of a process of high precision microelectronic die integration, according to a second embodiment of the present description.

FIGS. 18-23 illustrate side cross-sectional views of a process of high precision microelectronic die integration, according to a third embodiment of the present description.

DETAILED DESCRIPTION

Figure 3:
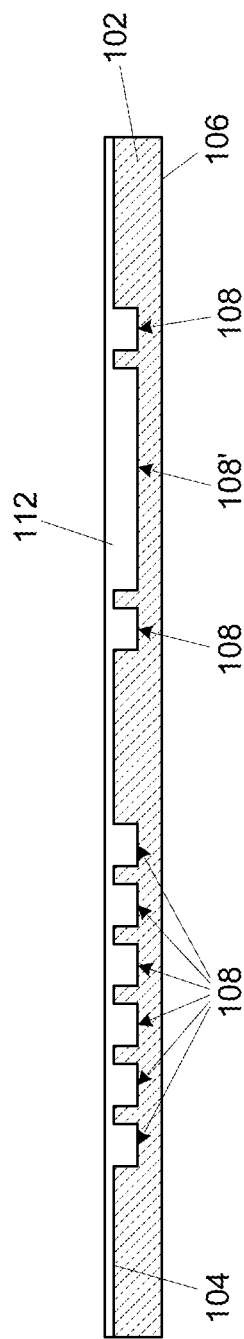

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to methods for the precise integration of microelectronic dice within a multichip package which substantially reduce or eliminate any misalignment caused by the movement of the microelectronic dice during the integration process. These methods may include the use of a temporary adhesive in conjunction with a carrier having at least one recess for microelectronic die alignment, the use of a precision molded carrier for microelectronic die alignment, the use of magnetic alignment of microelectronic dice on a reusable carrier, and/or the use of a temporary adhesive with molding processes on a reusable carrier. By substantially reducing or eliminating any misalignment caused by the movement of the microelectronic dice during the fabrication of a multichip package, the subject matter of the present description may enable fine pitch (e.g. less than 90 μm) interconnection structures and conductive trace line/space pitch (e.g. about 2-3 μm) between microelectronic dice, which may maximize the input/output density between the microelectronic dice in the multichip package and between the microelectronic dice and external components. Additionally, the subject matter of the present description may be compatible with panel level processing and may not restrict build-up layer count, as will be understood to those skilled in the art.

In a first embodiment, a first carrier 102 including a first surface 104 and an opposing second surface 106 and including at least one recess 108 formed therein extending into the first carrier 102 from the first carrier first surface 104 may be provided or formed, as shown in FIG. 1. Each first carrier recess 108 may correspond to a single interconnection of a microelectronic die, as will be subsequently discussed, to be inserted therein, such a configuration is illustrated in FIG. 2 (top plan view along line 2-2 of FIG. 1) on the left-hand side (illustrated as element A). In another embodiment, as illustrated in FIG. 2 (top plan view along line 2-2 of FIG. 1) on the right-hand side (illustrated as element B), at least one first carrier recess 108 may correspond to a single microelectronic die interconnection structure and at least one carrier recess (illustrated as element 108') may correspond to more than one microelectronic die interconnection structure.

The first carrier 102 may be any appropriate material, including, but not limited to, a glass material. Furthermore, the first carrier recesses 108 may be formed by any technique known in the art, including but not limited to lithographic technique and laser drilling. In one embodiment, a lithographic technique may be used to form the first carrier recesses 108, wherein a photoresist material layer (not shown) may be deposited over the carrier first surface, such as by lamination, slit coating, or spray, and openings may be formed through the photoresist material layer (not shown), such as with exposure and a developer bath or spray, as will be understood to those skilled in the art. A dry etch may then be used to form the first carrier recesses 108 through the photoresist material layer openings (not shown). With such a technique, an positional accuracy of at least +/−1 μm and a structural accuracy of about +/−1 μm may be achieved, as will be understood to those skilled in the art.

In another embodiment, a laser drill tool (not shown) may be used to form the first carrier recesses 108 by ablation. However, with such a technique, the accuracy may be lower relative to a lithographic technique. With such a technique, a positional accuracy of about +/−7 μm and a size variation of about +/−5 μm may result, as will be understood to those skilled in the art. In still another embodiment, an excimer laser drill with a mask (not shown), such as an aluminum mask may be used to form the first carrier recesses 108. With such a technique, a positional accuracy of at least +/−1 μm and a structural accuracy of about +/−1 μm may be achieved, as will be understood to those skilled in the art.

As shown in FIG. 3, an adhesive material layer 112 may be formed over the first carrier first surface 104 and into each of the first carrier recesses 108. The adhesive material layer 112 may be formed by any technique known in the art, including but not limited to, dispensing a liquid adhesive material, laminating an adhesive layer, and the like.

Figure 4:
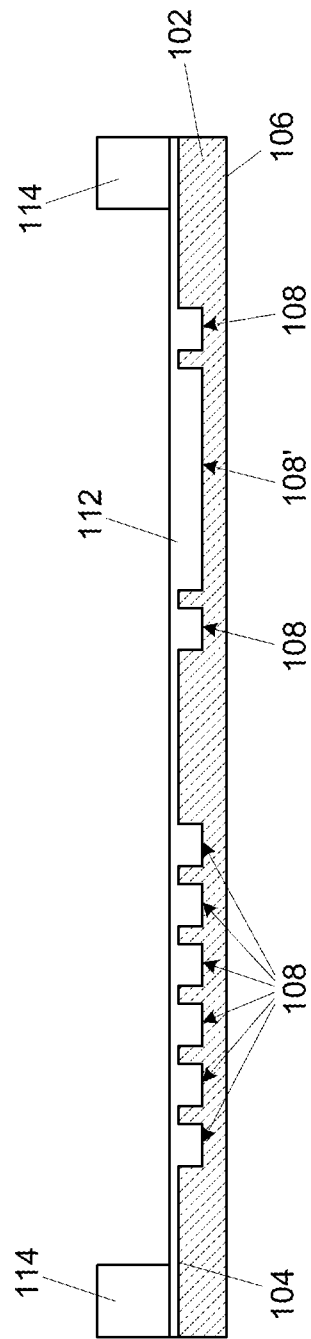

As shown in FIG. 4, a stiffener 114 may optionally be positioned to proximate the first carrier first surface 104, which may assist in stabilizing the first carrier 102. The stiffener 114 may be made of any appropriate material including but not limited to copper, copper alloys, copper-clad laminates, and the like. As the stiffener 114 is optional, for clarity, it will not be illustrated in subsequent figures.

Figure 5:
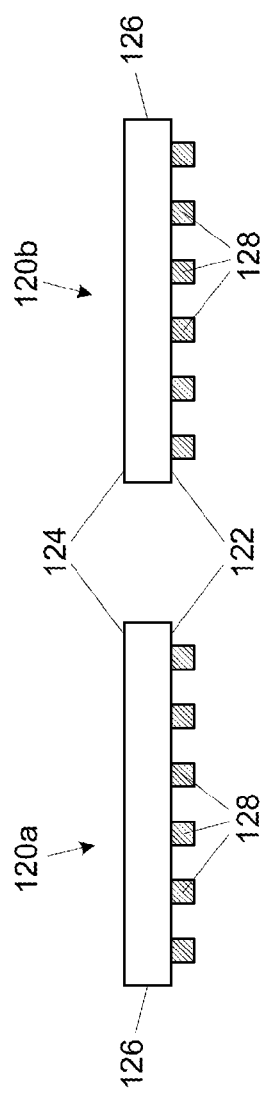

As shown in FIG. 5, at least one microelectronic die (illustrates as elements 120a and 120b) may be fabricated or provided, wherein each microelectronic die 120a and 120b may include an active surface 122 and an opposing back surface 124, with at least one sidewall 126 extending between the microelectronic die active surface 122 and the microelectronic die back surface 124. A plurality of interconnection structures 128, such as copper bumps, may extend from the microelectronic die active surface 122. As will be understood to those skilled in the art, the microelectronic die interconnection structures 128 may be electrically connected to integrated circuitry (not shown) of its respective microelectronic die 120a and 120b. Each microelectronic die 120a and 120b may be formed from any appropriate material, including, but not limited to silicon, germanium, silicon-germanium or III-V compound semiconductor material, and may include a silicon-on-insulator substrate. Each microelectronic die 120a and 120b may be any appropriate microelectronic device, including, but not limited to a microprocessor, a chipset, a graphics device, a wireless device, a memory device, an application specific integrated circuit device, and the like. It is understood that any number microelectronic dice could but incorporated using the disclosed process.

Figure 6:
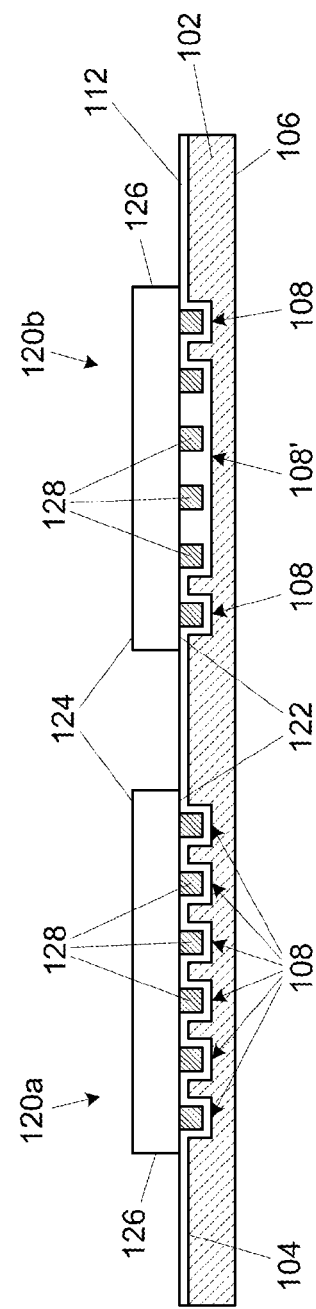

As illustrated in FIG. 6, each microelectronic die 120a and 120b is placed on the adhesive material layer 112 such that the microelectronic die interconnection structures 128 extend into corresponding first carrier recesses 108. In one embodiment, the first carrier 102, the adhesive material layer 112, and the microelectronic dice 120a and 120b may be heated, such as with a cure oven, to a temperature needed to enable full or partial cure during the placement of the microelectronic dice 120a and 120b, such as by thermocompressive bonding. It may also be advantageous for the coefficient of thermal expansion of the first carrier 102 to be about the same as the coefficient of thermal expansion of the microelectronic dice 120a and 120b. In another embodiment, the first carrier 102, the adhesive material layer 112, and the microelectronic dice 120a and 120b may be heated, such as with a cure oven or on a cure hot plate, to a temperature needed to enable full or partial cure after the placement of all of the microelectronic dice, e.g. microelectronic dice 120a and 120b.

As shown in FIG. 7, a portion of the adhesive material layer 112 not disposed between the first carrier 102 and the microelectronic dice 120a and 120b may be optionally removed by any appropriate technique known in the art, including, but not limited to, chemical cleaning, ashing with a reactive ion etch, and the like.

Figure 9:
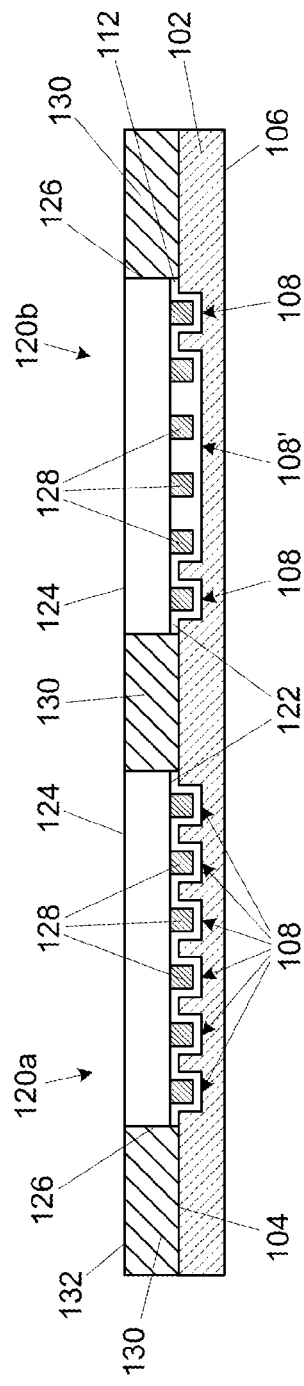

As shown in FIG. 8, the microelectronic dice 120a and 120b may be encapsulated in a mold material 130. As shown in FIG. 9, the mold material 130 may be optionally planarized, such as by grinding or chemical mechanical polishing (CMP) to form a planar surface 132. The planarization may expose the back surfaces 124 of the microelectronic dice 120a and 120b. It is understood that the back surfaces 124 of the microelectronic dice 120a and 120b need not be exposed by the planarization particularly when no through-silicon vias are present and/or when not heat dissipation devices are needed for the microelectronic dice 120a and 120b. Further, it is understood that planarization may not be necessary when the encapsulation technique results in the mold material planar surface 132 being sufficiently level, such as with the use of a mold chase.

Figure 10:
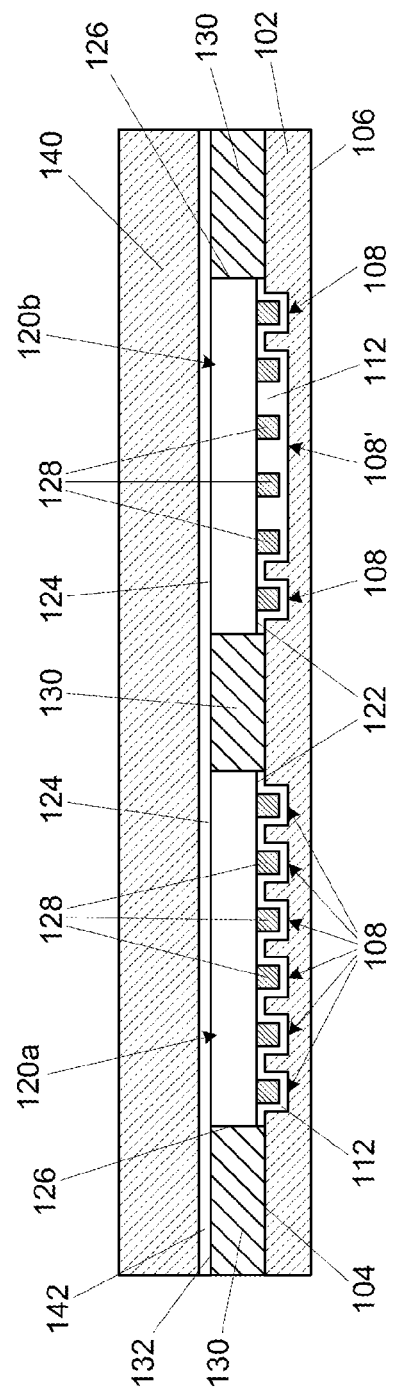
Figure 11:
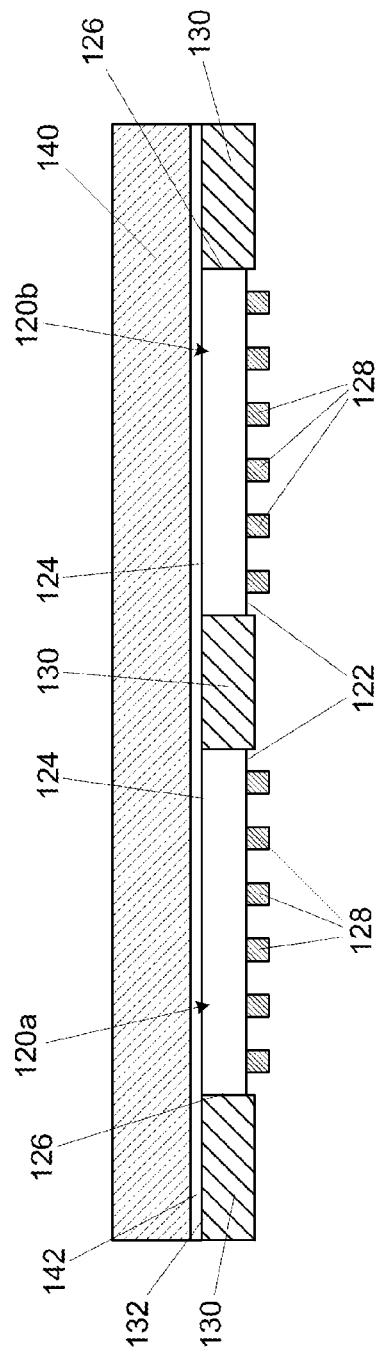

As shown in FIG. 10, a second carrier 140 may be attached to the mold material planar surface 132 with a layer of adhesive 142. The first carrier 120 may then be removed and the remaining adhesive material layer 112 may be removed, as shown in FIG. 11. The resulting structure may then have a build-up layer (not shown) formed thereon. The build-up layer (not shown) may comprise a plurality of dielectric layers with conductive traces formed therebetween with a plurality of conductive vias extending through the dielectric layers to electrical routes between microelectronic dice within a package and/or with external component, as will be understood to those skilled in the art. The processes for forming such build-up layers is well known in the art, and, for the sake of brevity and conciseness, will not be described or illustrated herein.

Figure 12:
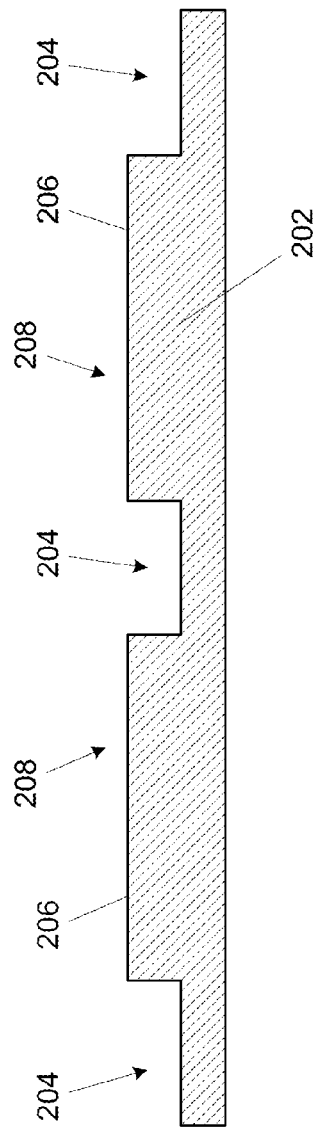

In a second embodiment, a mold 202 may be fabricated by forming at least one recess 204 therein from a first surface 206 of the mold 202, thereby result in at least one plateau 208, as shown in FIG. 12. The mold 202 may be any appropriate material, including, but not limited to, a glass material. Furthermore, the mold recess 208 may be formed by any technique known in the art, including but not limited to lithographic technique and laser drilling. In one embodiment, as with the formation of the carrier recesses 108 of FIG. 1, a lithographic technique may be used to form the mold recess 204, wherein a photoresist material layer (not shown) may be deposited over the carrier first surface, such as by lamination, slit coating, or spray, and openings may be formed through the photoresist material layer (not shown), such as with exposure and a developer bath or spray, as will be understood to those skilled in the art. A dry etch may then be used to form the mold recess 204 through the photoresist material layer openings (not shown). With such a technique, an positional accuracy of at least +/−1 μm and a structural accuracy of about +/−1 μm may be achieved, as will be understood to those skilled in the art.

In another embodiment, as with the formation of the carrier recesses 108 of FIG. 1, a laser drill tool (not shown) may be used to form the first mold recess 204 by ablation. However, with such a technique, the accuracy may be lower relative to a lithographic technique. With such a technique, a positional accuracy of about +/−7 µm and a size variation of about +/−5 µm may result, as will be understood to those skilled in the art. In still another embodiment, an excimer laser drill with a mask (not shown), such as an aluminum mask may be used to form the mold recesses 108. With such a technique, a positional accuracy of at least +/−1 µm and a structural accuracy of about +/−1 µm may be achieved, as will be understood to those skilled in the art.

As shown in FIG. 13, a mold resin 212, such as epoxy, may be deposited of the mold 202 and cured, such as by heating. The cured mold resin 212 may be separated from the mold 202 (see FIG. 13) to form a molded carrier 220, as shown in FIG. 14, wherein the mold plateaus 208 result in at least one recess 222 in the molded carrier 220 extending from a first surface 224 of the molded carrier 220. The molded carrier recesses 222 may have a bottom surface 226 and at least one sidewall 228.

Figure 15:
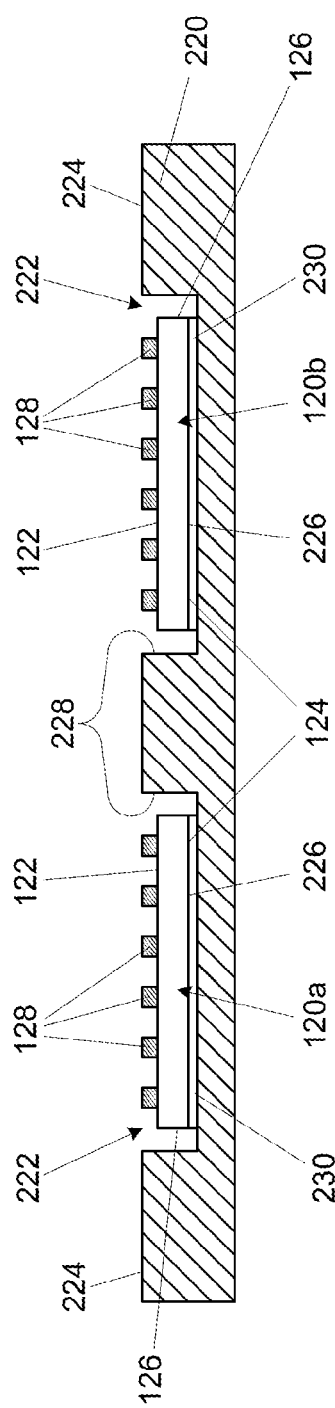

As shown in FIG. 15, at least one microelectronic die (illustrates as elements 120a and 120b) may be fabricated or provided, wherein the microelectronic dice 120a and 120b may be attached by the microelectronic die back surfaces 124 to the molded carrier recess bottom surface 226 with an adhesive layer 230. It is understood that the adhesive layer 230 may first be disposed on the microelectronic die back surface 124 or may first be disposed on the molded carrier recess bottom surface 226 prior to attachment. In one embodiment, the adhesive layer 230 may be laminated on the microelectronic die back surface 124 prior to placement within the molded carrier recess 222. In another embodiment, the adhesive layer 220 may be a pre-formed film positioned on the molded carrier recess bottom surface 226 and the microelectronic die 120a/120b may be positioned thereon with a pick and place tool, as will be understood to those skilled in the art. In still another embodiment, the adhesive layer 220 may be a predetermined amount of liquid adhesive dispensed on the molded carrier recess bottom surface 226, wherein the microelectronic die back surface 124 is placed thereon under a constant force and the adhesive layer 220 may then be cured.

Figure 16:
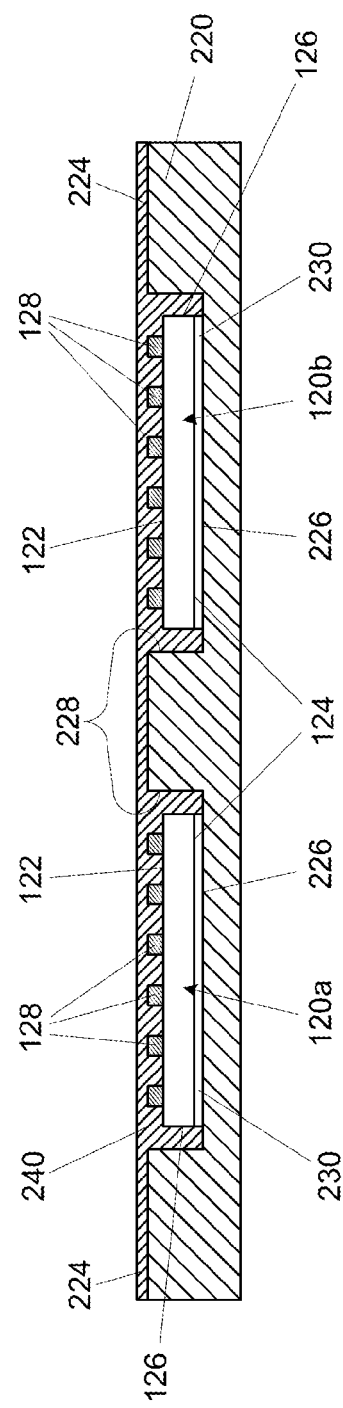
Figure 17:
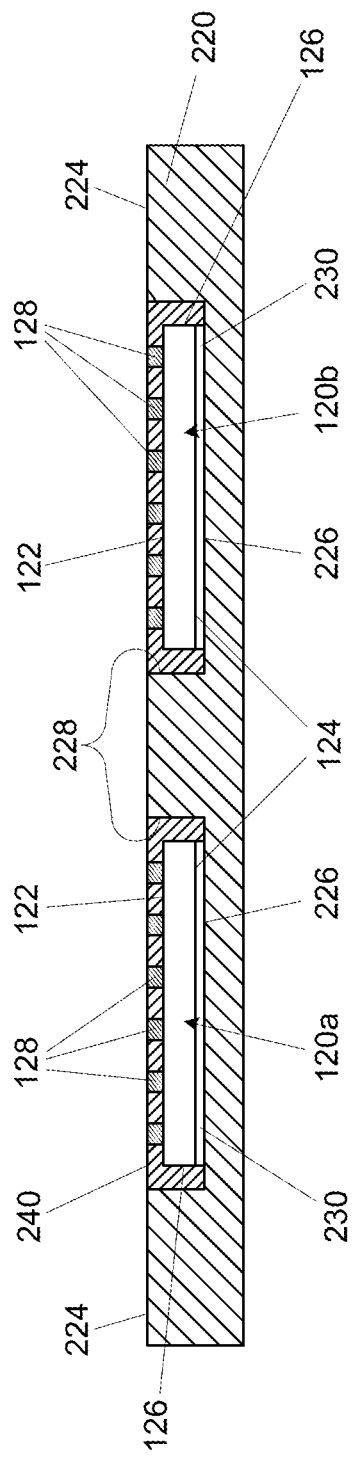

As shown in FIG. 16, an encapsulant material 230 may be dispensed over the molded carrier 220, over the microelectronic die active surface 122, and in the molded carrier recesses 222 (see FIG. 15), then cured. As shown in FIG. 17, the encapsulant material 230 may be planarized, such as by chemical mechanical polishing, such that encapsulant material 230 is substantially planar with the microelectronic die interconnection structures 128 (exposing them) and substantially planar with the molded carrier first surface 224. It is understood that the planarization may not be necessary if the microelectronic die interconnection structures 128 are exposed and the encapsulant material 240 is substantially planar with the molded carrier first surface 224. As will be understood to those skilled in the art, build-up layers (not shown) may be formed on the encapsulant material 230 and the molded carrier first surface 224.

Figure 18:
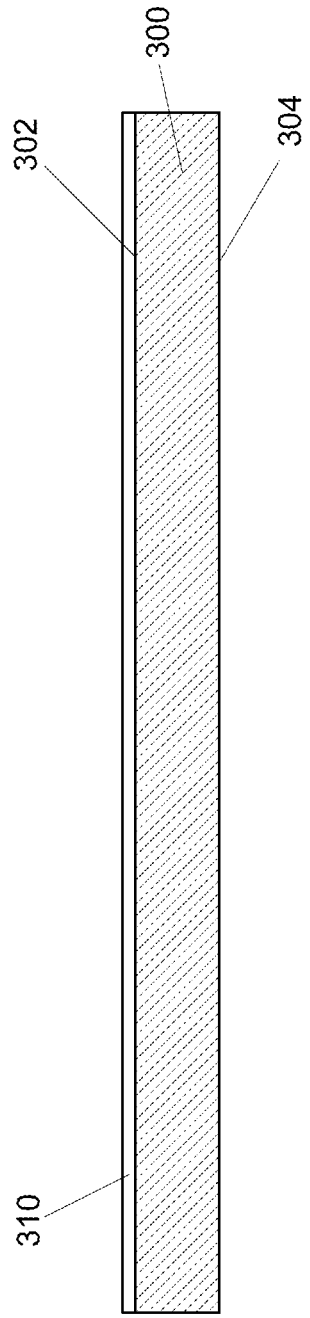

In a third embodiment, a reusable carrier 300 having a first surface 302 and a second surface 304 may be provided, wherein a die-bonding adhesive layer 310 may be disposed on the reusable carrier first surface 302, as shown in FIG. 18. At least one magnetic holding structure 320 may be placed proximate the reusable carrier second surface 304, as shown in FIG. 19. As further shown in FIG. 19, the magnetic holding structures 320 may include at least one permanent magnetic column 322. At least one microelectronic die (illustrates as elements 120a and 120b) may be fabricated or provided, wherein the microelectronic dice 120a and 120b may have at least one dummy (non-electrically conducting) magnetic structure 324. In one embodiment, the microelectronic die dummy magnetic structure 324 may be disposed on the microelectronic die active surface 122, as shown on microelectronic die 120a, or may be disposed on the microelectronic die back surface 124, as shown on microelectronic die 120b. It is understood that magnetic force, shown as dashed line 326, between corresponding magnetic columns 322 of the magnetic holding structures 320 and the dummy magnetic structures 324 of the microelectronic dice 120a and 120b may align the microelectronic dice 120a and 120b and retain their position on the reusable carrier 300.

Figure 21:
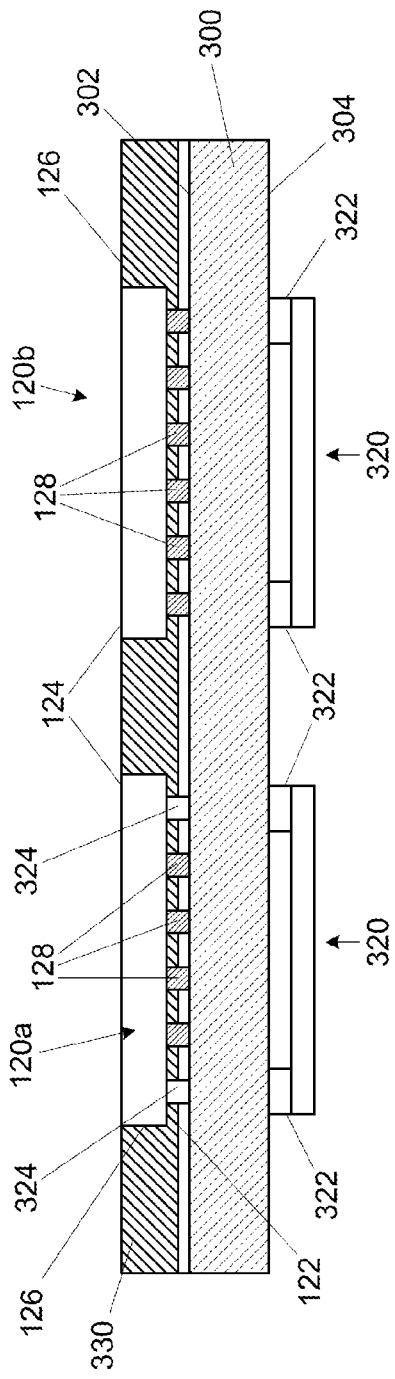
Figure 22:
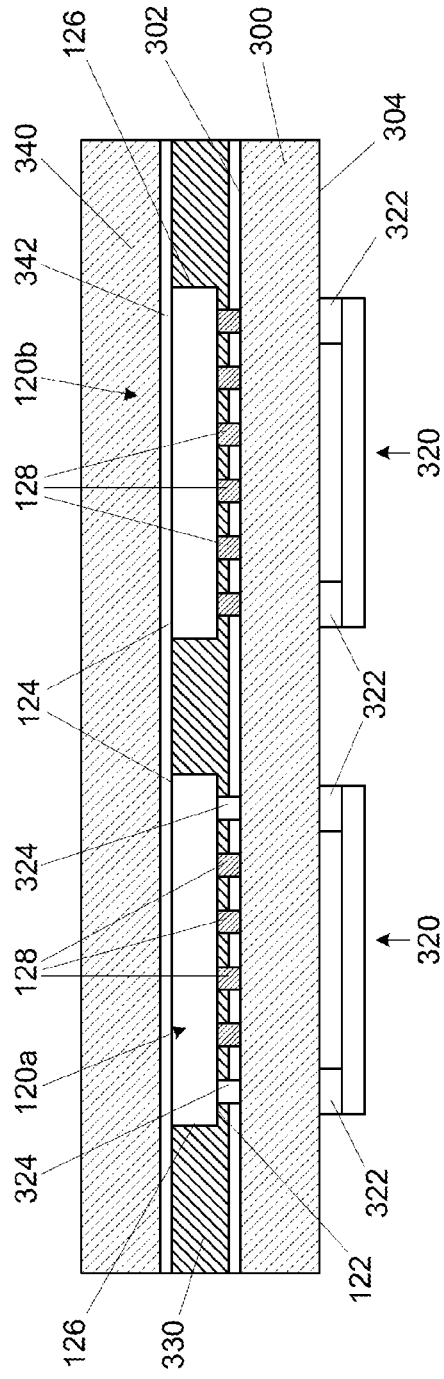
Figure 23:
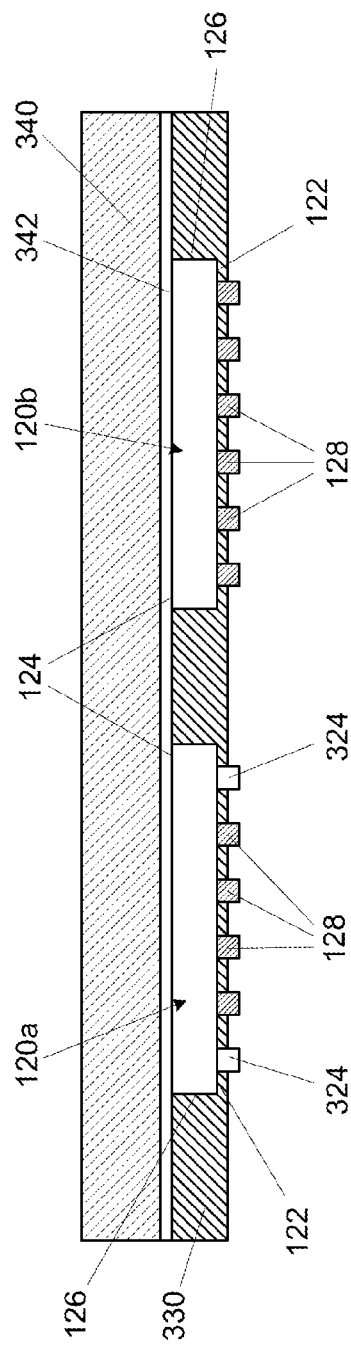

As shown in FIG. 20, an encapsulant material 330 may be disposed over the microelectronic dice 120a and 120b. As shown in FIG. 21, the encapsulant material 330 may be planarized to expose the microelectronic die back surfaces 124. A backside carrier 340 may be attached to the microelectronic die back surfaces 124 and the planarized encapsulant material 330 with an adhesive layer 342, as shown in FIG. 22. The reusable carrier 300 and the die-bonding adhesive layer 310 may then be removed, as shown in FIG. 23. The resulting structure may then have a build-up layer (not shown) formed thereon, as will be understood to those skilled in the art.

Figure 24:
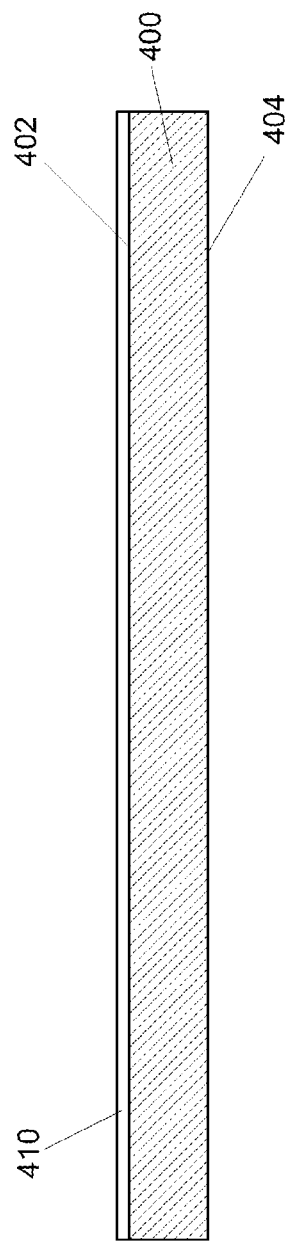
FIGS. 24-28 illustrate side cross-sectional views of a process of high precision microelectronic die integration, according to a fourth embodiment of the present description.
Figure 25:
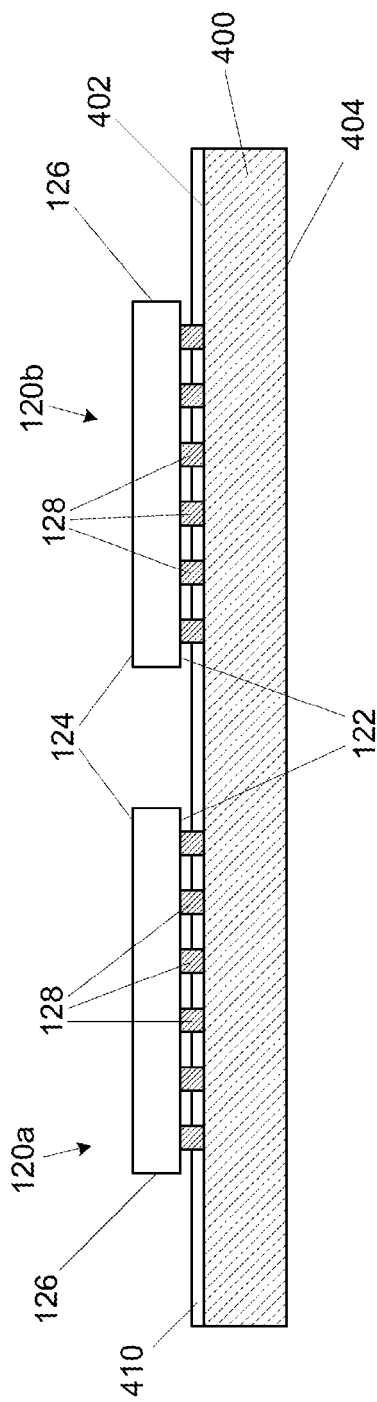
Figure 26:
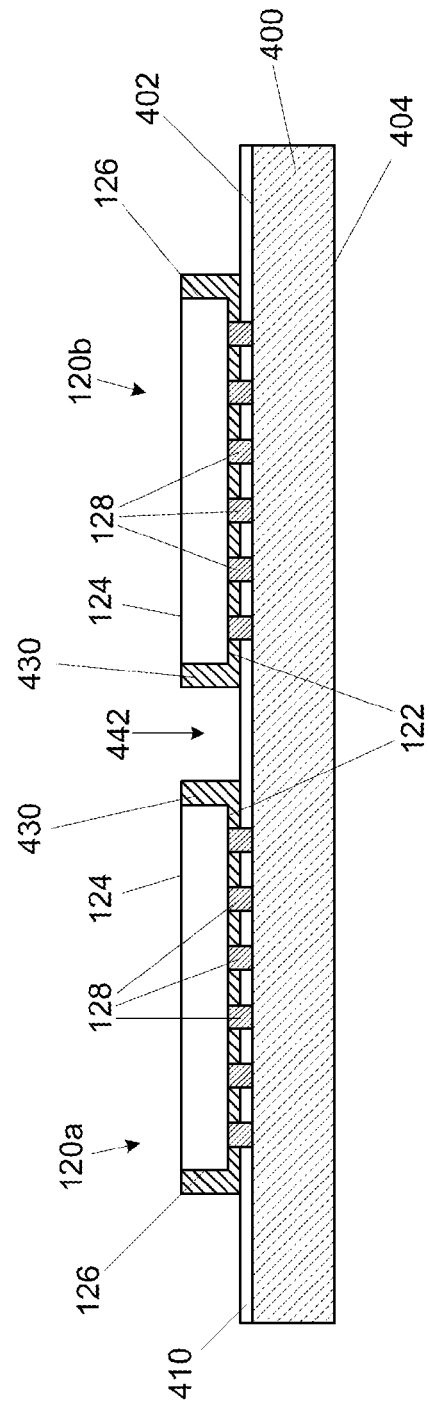

In a fourth embodiment, a reusable carrier 400 having a first surface 402 and a second surface 404 may be provided, wherein a die-bonding adhesive layer 410 may be disposed on the reusable carrier first surface 402, as shown in FIG. 24. At least one microelectronic die (illustrates as elements 120a and 120b) may be fabricated or provided, and may be adhered by its respective interconnection structures 128 to the die-bonding adhesive layer 410, such as by thermocompressive bonding, as shown in FIG. 25. In one embodiment, the die-bonding adhesive layer 410 does not contact the microelectronic die active surface 122. As shown in FIG. 26, an encapsulant material 430 may be molded adjacent microelectronic die sidewalls 126 and, in one embodiment, between the die-bonding adhesive layer 410 and the microelectronic die active surfaces 122 of each microelectronic dice 120a and 120b, without any encapsulant material 430 on the microelectronic die back surface 124, such as by individual transfer molding, as will be understood to those skilled in the art.

Figure 27:
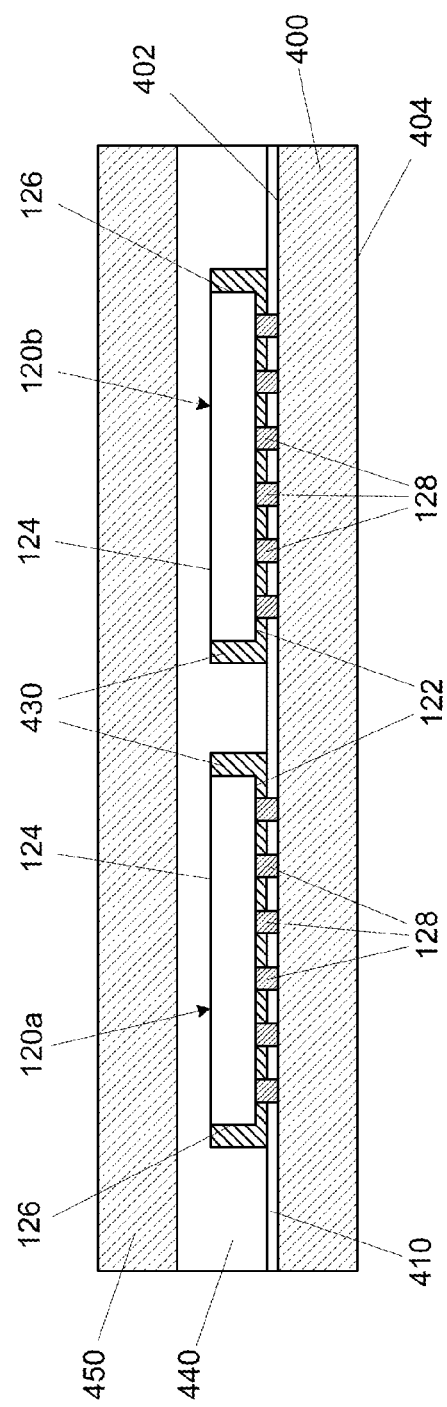
Figure 28:
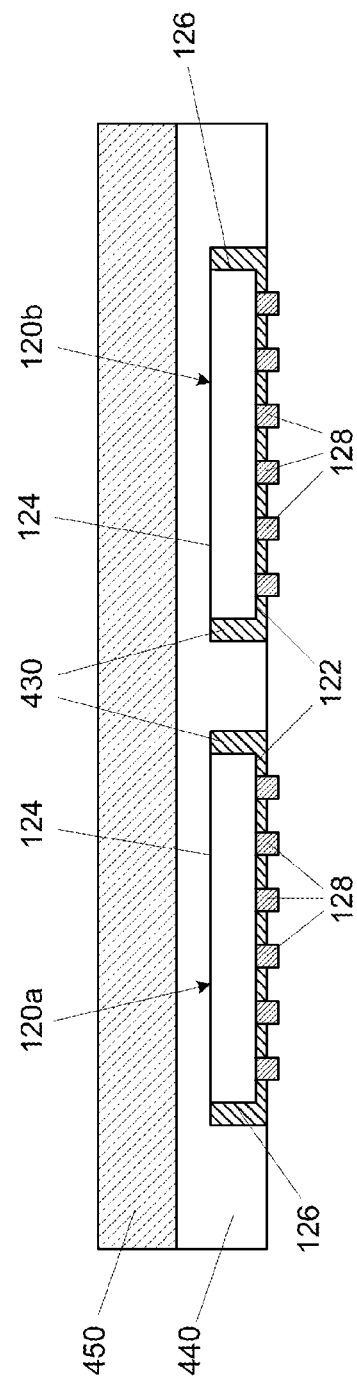

As shown in FIG. 27, an adhesive film 440 may be disposed over the microelectronic die back surfaces 124, the encapsulant material 430, and the exposed die-bonding adhesive layer 410, and a backside carrier 450 may be attached to the adhesive film 440 In one embodiment, the adhesive film 440 may extend into gaps 442 (see FIG. 25) between adjacent microelectronic dice 120a and 120b, such that a substantially planar surface is formed with the encapsulant material 430 for subsequent build-up layer formation, as will be understood to those skilled in the art. As shown in FIG. 28, the reusable carrier 400 and the die-bonding adhesive layer 410 may then be removed. The resulting structure may then have a build-up layer (not shown) formed thereon, as will be understood to those skilled in the art.

Figure 29:
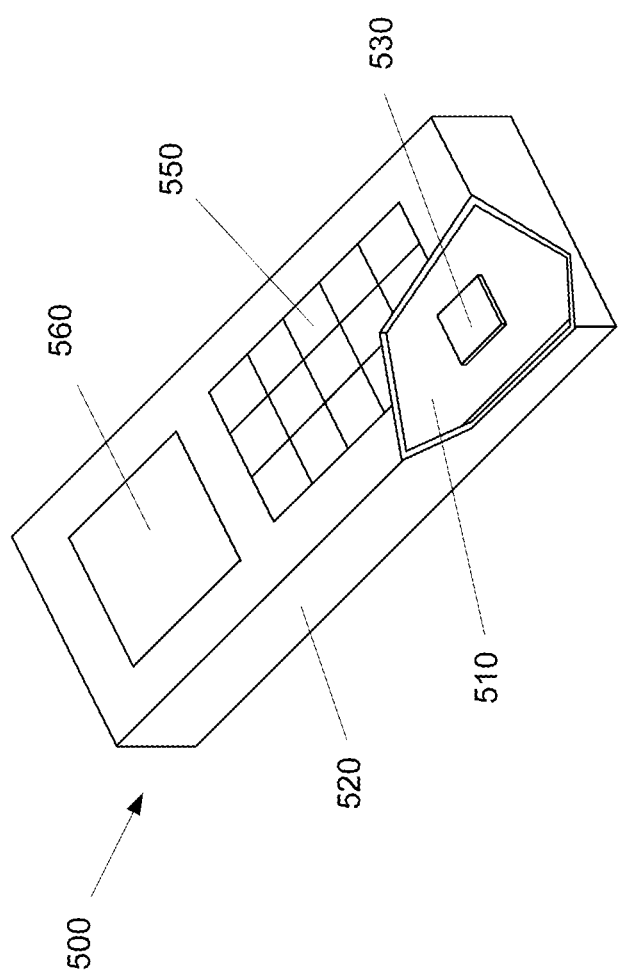
FIG. 29 illustrates an electronic system, according to one embodiment of the present description.

FIG. 29 illustrates an embodiment of an electronic system/device 500, such as a portable computer, a desktop computer, a mobile telephone, a digital camera, a digital music player, a web tablet/pad device, a personal digital assistant, a pager, an instant messaging device, or other devices. The electronic system/device 500 may be adapted to transmit and/or receive information wirelessly, such as through a wireless local area network (WLAN) system, a wireless personal area network (WPAN) system, and/or a cellular network. The electronic system/device 500 may include a microelectronic motherboard or substrate 510 disposed within a device housing 520. The microelectronic motherboard/substrate 510 may have various electronic components electrically coupled thereto, including a microelectronic die integrated within a microelectronic package, as described in the methods of the present description (see FIGS. 1-27), shown generically as element 530. The microelectronic motherboard 510 may be attached to various peripheral devices including an input device 550, such as keypad, and a display device 560, such an LCD display. It is understood that the display device 560 may also function as the input device, if the display device 560 is touch sensitive.

The following examples pertain to further embodiments, wherein Example 1 is a method of microelectronic die integration comprising forming a first carrier having a first surface and a second surface, forming at least one recess extending into the first carrier from the first carrier first surface, disposing an adhesive material layer over the first carrier first surface and into each of the first carrier recesses, providing at least one microelectronic die having an active surface and an opposing back surface with at least one sidewall extending therebetween and having a plurality of interconnection structures extending from the microelectronic die active surface, adhering the at least one microelectronic die to the adhesive material layer such that at least one microelectronic die interconnection structure extends into at least one first carrier recess, encapsulating the at least one microelectronic die with a mold material, attaching a second carrier to the encapsulant material with an adhesive layer, and removing the first carrier and the die-bonding adhesive layer.

In Example 2, the subject matter of Example 1 can optionally include forming the at least one recess extending into the first carrier from the first carrier first surface by lithography.

In Example 3, the subject matter of Example 1 can optionally include forming at least one recess extending into the first carrier from the first carrier first surface by laser drilling.

In Example 4, the subject matter of any of Examples 1 to 3 can optionally include adhering the at least one microelectronic die to the adhesive material layer such that a single microelectronic die interconnection structure extends into a corresponding single first carrier recess.

In Example 5, the subject matter of any of Examples 1 to 3 can optionally include adhering the at least one microelectronic die to the adhesive material layer such that more than one microelectronic die interconnection structure extends into a corresponding single first carrier recess.

In Example 6, the subject matter of any of Examples 1 to 5 can optionally include heating the adhesive material layer to a temperature needed for full or partial cure during the placement of the at least one microelectronic die.

In Example 7, the subject matter of any of Examples 1 to 5 can optionally include heating the adhesive material layer to a temperature needed for full or partial cure after the placement of the at least one microelectronic die.

In Example 8, the subject matter of any of Examples 1 to 7 can optionally include positioning a stiffener proximate the first carrier first surface.

In Example 9, the subject matter of any of Examples 1 to 8 can optionally include removing a portion of the adhesive material layer not disposed between the first carrier and the at least one microelectronic die prior to encapsulating the at least one microelectronic die with a mold material.

In Example 10, the subject matter of any of Examples 1 to 9 can optionally include planarizing the mold material.

In Example 11, the subject matter of Example 10 can optionally planarizing the mold material further includes exposing the back surface of the at least one microelectronic die.

The following examples pertain to further embodiments, wherein Example 12 is a method of microelectronic integration, comprising forming a mold having at least one plateau, disposing a mold resin over the mold to form a molded carrier, separating the molded carrier from the mold, wherein the at least one mold plateaus forms at least one recess in the molded carrier that extends into the molded carrier from a first surface thereof to define a recess bottom surface and at least one recess sidewall, providing at least one microelectronic die having an active surface and an opposing back surface with at least one sidewall extending therebetween and having a plurality of interconnection structures extending from the microelectronic die active surface, adhering the at least one microelectronic die back surface to the mold recess bottom surface with an adhesive layer, dispensing an encapsulant material in the molded carrier recess to encapsulating the at least one microelectronic die, attaching a second carrier to the encapsulant material with an adhesive layer, and removing the first carrier and the die-bonding adhesive layer.

In Example 13, the subject matter of Example 12 can optionally include forming the at least one recess extending into the mold from a mold first surface by lithography to form the at least one plateau.

In Example 14, the subject matter of Example 12 can optionally include forming at least one recess extending into the mold from a mold first surface by laser drilling to form the at least one plateau.

In Example 15, the subject matter of any of Examples 12 to 14 can optionally include disposing the adhesive layer on the at least one microelectronic die back surface.

In Example 16, the subject matter of Example 15 can optionally include laminating the adhesive layer on the least one microelectronic die back surface.

In Example 17, the subject matter of any of Examples 12 to 14 can optionally include disposing the adhesive layer on the at least one mold recess bottom surface.

In Example 18, the subject matter of Example 17 can optionally include positioning a pre-formed adhesive film on the molded carrier recess bottom surface.

In Example 19, the subject matter of any of Examples 12 to 18 can optionally include curing the encapsulant material.

In Example 20, the subject matter of any of Examples 12 to 19 can optionally include planarizing the encapsulant material to be substantially planar with the microelectronic die interconnection structures and substantially planar with the molded carrier first surface.

The following examples pertain to further embodiments, wherein Example 21 is a method of microelectronic die integration, comprising providing a reusable carrier having a first surface and a second surface, disposing a die-bonding adhesive layer on the reusable carrier first surface, placing at least one magnetic holding structure proximate the reusable carrier second surface, wherein the at least one magnetic holding structure includes at least one permanent magnetic column, providing at least one microelectronic die having an active surface and an opposing back surface with at least one sidewall extending therebetween and having a plurality of interconnection structures extending from the microelectronic die active surface, wherein the at least one microelectronic die includes at least one dummy magnetic column disposed on at least one of the microelectronic die active surface and the microelectronic die back surface, aligning the at least one microelectronic die with a magnetic force between the at least one magnetic holding structure magnetic column and the at least one microelectronic die dummy magnetic columns, adhering the plurality of interconnection structures to the die-bonding adhesive layer, disposing an encapsulant material over the at least one microelectronic die, attaching a backside carrier to the encapsulant material with adhesive layer, and removing the reusable carrier and the die-bonding adhesive layer.

In Example 22, the subject matter of Example 21 can optionally include planarizing the encapsulant material to expose the back surface of the at least one microelectronic die.

The following examples pertain to further embodiments, wherein Example 23 is a method of microelectronic die integration, comprising providing a reusable carrier having a first surface and a second surface, disposing a die-bonding adhesive layer on the reusable carrier first surface, providing at least one microelectronic die having an active surface and an opposing back surface with at least one sidewall extending therebetween and having a plurality of interconnection structures extending from the microelectronic die active surface, adhering the plurality of interconnection structures to the die-bonding adhesive layer, molding an encapsulant material adjacent the microelectronic die sidewalls, disposing an adhesive film adjacent the encapsulant material, attaching a backside carrier to the encapsulant with an adhesive film, and removing the reusable carrier and the die-bonding adhesive layer.

In Example 24, the subject matter Examples 23 can optionally include thermocompressive bonding the plurality of interconnection structures to the die-bonding adhesive layer.

In Example 25, the subject matter of any of Examples 23 to 24 can optionally include molding the encapsulant material adjacent the microelectronic die sidewalls by individually transfer molding each microelectronic die.

In Example 26, the subject matter of any of Examples 23 to 25 can optionally include the at least one heat dissipation device comprising a thermally conductive material selected from a group consisting of copper and silver.

In Example 27, the subject matter of Example 26 can optionally include disposing the adhesive film on the microelectronic die back surfaces.

In Example 28, the subject matter of any of Examples 23 to 27 can optionally include the adhesive film extending in gaps between adjacent microelectronic dice.

It is understood that the subject matter of the present description is not necessarily limited to specific applications illustrated in FIGS. 1-28. The subject matter may be applied to other microelectronic device applications, as well as applications outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method comprising
forming a first carrier having a first surface and a second surface;
forming at least one recess extending into the first carrier from the first carrier first surface;
disposing die-bonding adhesive material layer over the first carrier first surface and into each of the first carrier recesses
providing at least one microelectronic die having an active surface and an opposing back surface with at least one sidewall extending therebetween and having a plurality of interconnection structures extending from the microelectronic die active surface;
adhering the at least one microelectronic die to the adhesive material layer such that at least one microelectronic die interconnection structure extends into the at least one first carrier recess;
encapsulating the at least one microelectronic die with a mold material;
attaching a second carrier to the encapsulant material with an adhesive layer; and
removing the first carrier and the die-bonding adhesive material layer.

2. The method of claim 1, wherein forming at least one recess extending into the first carrier from the first carrier first surface comprises forming at least one recess extending into the first carrier from the first carrier first surface by lithography.

3. The method of claim 1, wherein forming at least one recess extending into the first carrier from the first carrier first surface comprises forming at least one recess extending into the first carrier from the first carrier first surface by laser drilling.

4. The method of claim 1, wherein adhering the at least one microelectronic die to the adhesive material layer such that at least one microelectronic die interconnection structures extends into at least one first carrier recesses comprising adhering the at least one microelectronic die to the adhesive material layer such that a single microelectronic die interconnection structures extends into corresponding single first carrier recess.

5. The method of claim 1, wherein adhering the at least one microelectronic die to the adhesive material layer such that at least one microelectronic die interconnection structure extends into at least one first carrier recess comprising adhering the at least one microelectronic die to the adhesive material layer such that more than one microelectronic die interconnection structure extends into a corresponding single first carrier recess.

6. The method of claim 1, wherein adhering the at least one microelectronic die to the adhesive material layer such that at least one microelectronic die interconnection structure extends into at least one first carrier recess further comprises heating the adhesive material layer to a temperature needed for full or partial cure during the placement of the at least one microelectronic die.

7. The method of claim 1, wherein adhering the at least one microelectronic die to the adhesive material layer such that at least one microelectronic die interconnection structure extends into at least one first carrier recess further comprises heating the adhesive material layer to a temperature needed for full or partial cure after the placement of the at least one microelectronic die.

8. The method of claim 1, further including positioning a stiffener proximate the first carrier first surface.

9. The method of claim 1, further including removing a portion of the adhesive material layer not disposed between the first carrier and the at least one microelectronic die prior to encapsulating the at least one microelectronic die with the mold material.

10. The method of claim 1, further comprising planarizing the mold material.

11. The method of claim 10, wherein planarizing the mold material further includes exposing the back surface of the at least one microelectronic die.

12. A method comprising
forming a first carrier having a first surface and a second surface;
forming a plurality of recesses extending into the first carrier from the first carrier first surface;

disposing die-bonding adhesive material layer over the first carrier first surface and into each of the plurality of first carrier recesses providing at least one microelectronic die having an active surface and an opposing back surface with at least one sidewall extending therebetween and having a plurality of interconnection structures extending from the microelectronic die active surface, wherein each of the plurality of first carrier recesses is sized to receive a single corresponding interconnection structure of the plurality of interconnection structures;

adhering the at least one microelectronic die to the adhesive material layer such that each of the plurality of microelectronic die interconnection structures extends into a corresponding first carrier recess;

encapsulating the at least one microelectronic die with a mold material;

attaching a second carrier to the encapsulant material with an adhesive layer; and removing the first carrier and the die-bonding adhesive material layer.

13. The method of claim 12, wherein forming the plurality of recesses extending into the first carrier from the first carrier first surface comprises forming the plurality of recesses extending into the first carrier from the first carrier first surface by lithography.

14. The method of claim 12, wherein forming the plurality of recesses extending into the first carrier from the first carrier first surface comprises forming the plurality of recesses extending into the first carrier from the first carrier first surface by laser drilling.

15. The method of claim 12, wherein adhering the at least one microelectronic die to the adhesive material layer such that at least one microelectronic die interconnection structure extends into at least one first carrier recess further comprises heating the adhesive material layer to a temperature needed for full or partial cure during the placement of the at least one microelectronic die.

16. The method of claim 12, wherein adhering the at least one microelectronic die to the adhesive material layer such that each of the plurality of microelectronic die interconnection structures extends into a corresponding first carrier recess further comprises heating the adhesive material layer to a temperature needed for full or partial cure after the placement of the at least one microelectronic die.

17. The method of claim 12, further including positioning a stiffener proximate the first carrier first surface.

18. The method of claim 12, further including removing a portion of the adhesive material layer not disposed between the first carrier and the at least one microelectronic die prior to encapsulating the at least one microelectronic die with a mold material.

19. The method of claim 12, further comprising planarizing the mold material.

20. The method of claim 10, wherein planarizing the mold material further includes exposing the back surface of the at least one microelectronic die.

21. A method comprising forming a first carrier having a first surface and a second surface;

forming a plurality of recesses extending into the first carrier from the first carrier first surface;

disposing die-bonding adhesive material layer over the first carrier first surface and into each of the plurality of first carrier recesses providing at least one microelectronic die having an active surface and an opposing back surface with at least one sidewall extending therebetween and having a plurality of interconnection structures extending from the microelectronic die active surface, wherein at least one of the plurality of first carrier recesses is sized to receive a single corresponding interconnection structure of the plurality of interconnection structures and wherein at least another of the plurality of first carrier recesses is sized to receive more than one interconnection structure of the plurality of interconnection structures;

adhering the at least one microelectronic die to the adhesive material layer such that each of the plurality of microelectronic die interconnection structures extends into a corresponding first carrier recess;

encapsulating the at least one microelectronic die with a mold material;

attaching a second carrier to the encapsulant material with an adhesive layer; and removing the first carrier and the die-bonding adhesive material layer.

22. The method of claim 21, wherein forming the plurality of recesses extending into the first carrier from the first carrier first surface comprises forming the plurality of recesses extending into the first carrier from the first carrier first surface by lithography.

23. The method of claim 21, wherein forming the plurality of recesses extending into the first carrier from the first carrier first surface comprises forming the plurality of recesses extending into the first carrier from the first carrier first surface by laser drilling.

24. The method of claim 21, wherein adhering the at least one microelectronic die to the adhesive material layer such that at least one microelectronic die interconnection structure extends into at least one first carrier recess further comprises heating the adhesive material layer to a temperature needed for full or partial cure during the placement of the at least one microelectronic die.

25. The method of claim 21, wherein adhering the at least one microelectronic die to the adhesive material layer such that each of the plurality of microelectronic die interconnection structures extends into a corresponding first carrier recess further comprises heating the adhesive material layer to a temperature needed for full or partial cure after the placement of the at least one microelectronic die.

26. The method of claim 21, further including positioning a stiffener proximate the first carrier first surface.

27. The method of claim 21, further including removing a portion of the adhesive material layer not disposed between the first carrier and the at least one microelectronic die prior to encapsulating the at least one microelectronic die with a mold material.

28. The method of claim 21, further comprising planarizing the mold material.

* * * * *